United States Patent
Bhatnagar et al.

(10) Patent No.: US 7,045,020 B2
(45) Date of Patent: May 16, 2006

(54) CLEANING A COMPONENT OF A PROCESS CHAMBER

(75) Inventors: Ashish Bhatnagar, Fremont, CA (US); Charles S. Kunze, Cupertino, CA (US)

(73) Assignee: Applied Materials, Inc., Santa Clara, CA (US)

(*) Notice: Subject to any disclaimer, the term of this patent is extended or adjusted under 35 U.S.C. 154(b) by 510 days.

(21) Appl. No.: 10/444,284

(22) Filed: May 22, 2003

(65) Prior Publication Data

US 2004/0231706 A1  Nov. 25, 2004

(51) Int. Cl.
*B08B 7/04* (2006.01)

(52) U.S. Cl. ............... 134/28; 134/1.1; 134/3; 134/8; 438/905

(58) Field of Classification Search ............... 134/26, 134/28, 2, 3, 1, 1.1, 6, 8, 22.1, 22.11; 438/905
See application file for complete search history.

(56) References Cited

U.S. PATENT DOCUMENTS

| | | | |
|---|---|---|---|
| 5,507,874 A | | 4/1996 | Su et al. |
| 5,522,412 A * | | 6/1996 | Ohba et al. ............ 134/104.1 |
| 5,539,609 A | | 7/1996 | Collins et al. |
| 5,549,802 A * | | 8/1996 | Guo ..................... 204/298.11 |
| 5,660,640 A * | | 8/1997 | Laube ....................... 134/1 |
| 5,671,119 A | | 9/1997 | Huang et al. |
| 5,746,928 A | | 5/1998 | Yen et al. |
| 6,170,496 B1 * | | 1/2001 | Chen et al. ............ 134/102.1 |
| 6,305,390 B1 * | | 10/2001 | Jeon ....................... 134/1.1 |
| 6,926,016 B1 * | | 8/2005 | Zuck et al. ............... 134/84 |
| 2003/0136428 A1 * | | 7/2003 | Krogh ....................... 134/28 |

FOREIGN PATENT DOCUMENTS

| EP | 489398 A1 * | 6/1992 |
|---|---|---|
| EP | 1174527 A1 * | 1/2002 |

OTHER PUBLICATIONS

Search report for WO 2004105972 A1, Dec. 2004.*

\* cited by examiner

*Primary Examiner*—Alexander Markoff
(74) *Attorney, Agent, or Firm*—Janah & Associates

(57) ABSTRACT

Process deposits formed on a component of a process chamber are cleaned. In the cleaning method, gas holes in the component are mechanically pinned to clean the process deposits therein. A ceramic portion of the component is then exposed to an acidic solution, such as a solution of hydrofluoric acid and nitric acid. Mechanical pinning of the gas holes may be repeated after the acid cleaning step. The component is then plasma stabilized in a plasma zone by introducing a non-reactive gas into the plasma zone and forming a plasma of the non-reactive gas in the plasma zone. In one version, the component comprises an electrostatic chuck comprising a ceramic covering an electrode and having the gas holes therein.

11 Claims, 5 Drawing Sheets

CLEANING A COMPONENT OF A PROCESS CHAMBER

BACKGROUND

Embodiments of the present invention relate to cleaning a component used in the processing of a substrate in a process chamber.

To manufacture electronic circuits and displays, a substrate such as a semiconductor wafer or display, is placed in a chamber and processed in a plasma of process gas. For example, in a PVD process, a plasma sputters a target of sputtering material to deposit sputtered target material on the substrate. In a CVD process, a plasma of a deposition gas is used to deposit material on the substrate. In etch processes, a plasma is used to etch material on the substrate. The chamber has a number of components that are exposed to the plasma during processing, for example, a substrate support that holds the substrate, liners, gas distribution or exhaust rings, and focus rings.

In such substrate processes, the plasma forms process deposits on the surfaces of the chamber components that have to be periodically cleaned off. In one cleaning method, the chamber components are removed from the chamber and immersed in a cleaning solution, such as an acidic or basic solution. In another method, the component remains in the chamber, a cleaning gas in introduced in the chamber and a plasma is formed of the cleaning gas to clean off the process deposits. However, such cleaning methods often leave behind process deposits which are chemically adhered to the component or which are deposited in especially thick layers.

Components such as a gas distributors, liners and electrostatic chucks, are especially difficult to clean because they have holes in them for the passage of gas or for other reasons. For example, the gas distributor has a number of gas holes to release a processing gas into the chamber. An electrostatic chuck also has gas holes to release a heat transfer gas below the substrate. In a typically chuck, the gas holes are spaced apart and distributed around the ceramic surface to supply heat transfer gas to desired locations below the substrate. The holes are usually small to prevent plasma or glow discharges from forming inside the holes during use of the electrostatic chuck. Conventional cleaning processes often do not adequately clean off the process deposits formed inside the small holes by such a gas plasma. For example, acidic or basic solutions used in wet cleaning processes may not enter into the gas holes because they are either filled-up with process deposits or because surface tension forces prevent the solution from entering the small holes. In dry cleaning processes, the plasma also often does not permeate fully into the holes. When these holes are not properly cleaned, the electrostatic chuck provides an uneven distribution of gas behind the substrate, and the substrate is not properly cooled or heated. The same problem is faced when cleaning a gas distributor or liner having small gas holes.

Another problem arises when trying to cleaning process deposits on ceramic surfaces, such as a ceramic surface of a chuck. Ceramic chucks provide good tolerance to heat and resistance to chemical erosion from erosive gas plasma environments. However, PVD and CVD deposits often strongly adhere to the ceramic surfaces and are difficult to remove using conventional cleaning methods. The ceramic surface can be eroded by a chemically strong cleaning solution. The brittleness of the ceramic material also makes it difficult to clean the surface by abrasion, or to clean the gas holes in the ceramic material without causing fractures or micro-cracks in the ceramic. When a ceramic surface is damaged, the chamber plasma penetrates through the damaged areas to erode the exposed underlying surfaces, and can also cause arcing and electrical shorts with the chuck electrode, eventually leading to failure of the chuck during processing and loss of the substrate.

Thus, it is desirable to effectively clean a chamber component so that the component has desirable surface properties in a plasma processing environment. It is further desirable to uniformly clean all the gas holes in an electrostatic chuck or other component, so that the cleaned structure can provide a uniform distribution of gas in the chamber. It is also desirable for the cleaning process to provide consistent and reproducible cleaning results.

SUMMARY

Process deposits on the surface and in the gas holes of a component of a process chamber are cleaned. The gas holes are cleaned by mechanically pinning the holes to remove the process deposits from the hole surfaces. In addition, the process deposits on a ceramic of the component are exposed to an acidic solution, such as a solution of hydrofluoric acid and nitric acid, to remove the deposits. The component is plasma stabilized by placing the component into a plasma zone, introducing a non-reactive gas into the plasma zone, forming a plasma of the non-reactive gas in the plasma zone, and exhausting the non-reactive gas from the plasma zone.

The cleaning method may be used to clean an electrostatic chuck of the process chamber. The mechanical pinning step is repeated after the acid cleaning step to remove process deposits that are loosened by the pinning process. The electrical resistance of the ceramic may also be tested to ensure that the ceramic has not failed during the mechanical pinning or acid cleaning.

In the mechanical pinning step, a pinning tool can be used to clean the process deposits from the gas holes of the chamber component. The pinning tool includes a housing and a plurality of elongated pins protruding from the housing. The elongated pins are spaced apart to match a layout of the gas holes in the electrostatic chuck.

The cleaned chamber component provides better processing repeatability and yields through removal of the process deposits formed on the component. It can also exhibit stable performance in plasma processes with reduced outgassing of contaminants.

DRAWINGS

These features, aspects, and advantages of the present invention will become better understood with regard to the following description, appended claims, and accompanying drawings which illustrate examples of the invention. However, it is to be understood that each of the features can be used in the invention in general, not merely in the context of the particular drawings, and the invention includes any combination of these features, where:

FIG. 2b is a sectional side view of the electrostatic chuck of FIG. 2a;

DESCRIPTION

Figure 1:
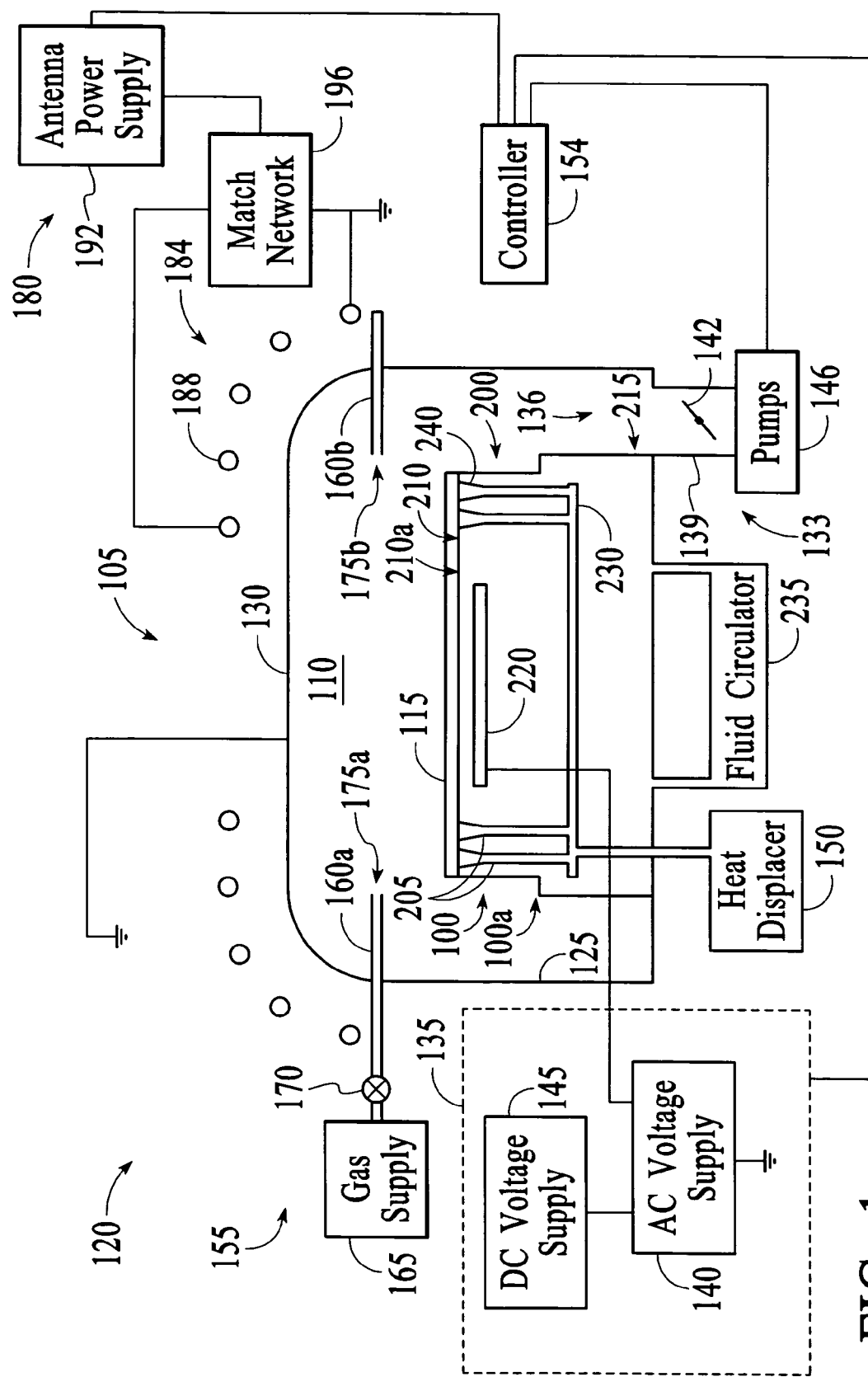
FIG. 1 is a schematic sectional side view of a substrate processing apparatus comprising a process chamber.

A component 100 of a process chamber 105 is cleaned to remove process deposits that accumulate on surfaces of the component 100 during active use in the process chamber 105. The process chamber 105 defines a process zone 110 in which a substrate 115, such as a semiconductor wafer or flat panel display, is processed by a plasma. The process chamber 105 is part of a substrate processing apparatus 120, an exemplary embodiment of which is illustrated in FIG. 1. The component 100 has a plurality of gas holes 205, such as in a ceramic 200, an embodiment of which is illustrated from a top perspective in FIG. 2a. For example, the gas holes 205 may be shaped and sized to transmit a heat transfer gas or a process gas into the process chamber 105. Cleaning the component 100 removes process deposits that accumulate on a surface 210 of the component 100 during plasma exposure, and along the inner surface of the gas holes 205 when gas is flowed through them.

In one version, the component 100 comprises a gas distributor 155 that introduces a process gas into the process chamber 105 to process the substrate 115. The gas distributor 155 comprises a plurality of gas feed conduits 160a,b that transport process gas from a gas supply 165 to one, or more gas outlets 175a,b in the process chamber 105. A gas flow valve 170 regulates the flow of the process gas through the gas feed conduits 160a,b, and therefore through the gas outlets 175a,b. The gas outlets 175a,b are spaced apart and arranged to uniformly release process gas into the process zone 110. For example, the outlets 175a,b may between two to twelve outlets located peripherally around the substrate 115 (as shown in FIG. 1). In another example, the gas distributor 155 comprises a perforated showerhead plate (not shown) above the substrate that spreads process gas laterally and downward toward the process zone 110 through a pattern of coplanar gas outlets to provide a uniform distribution of process gas in the process zone 110.

Figure 2A:
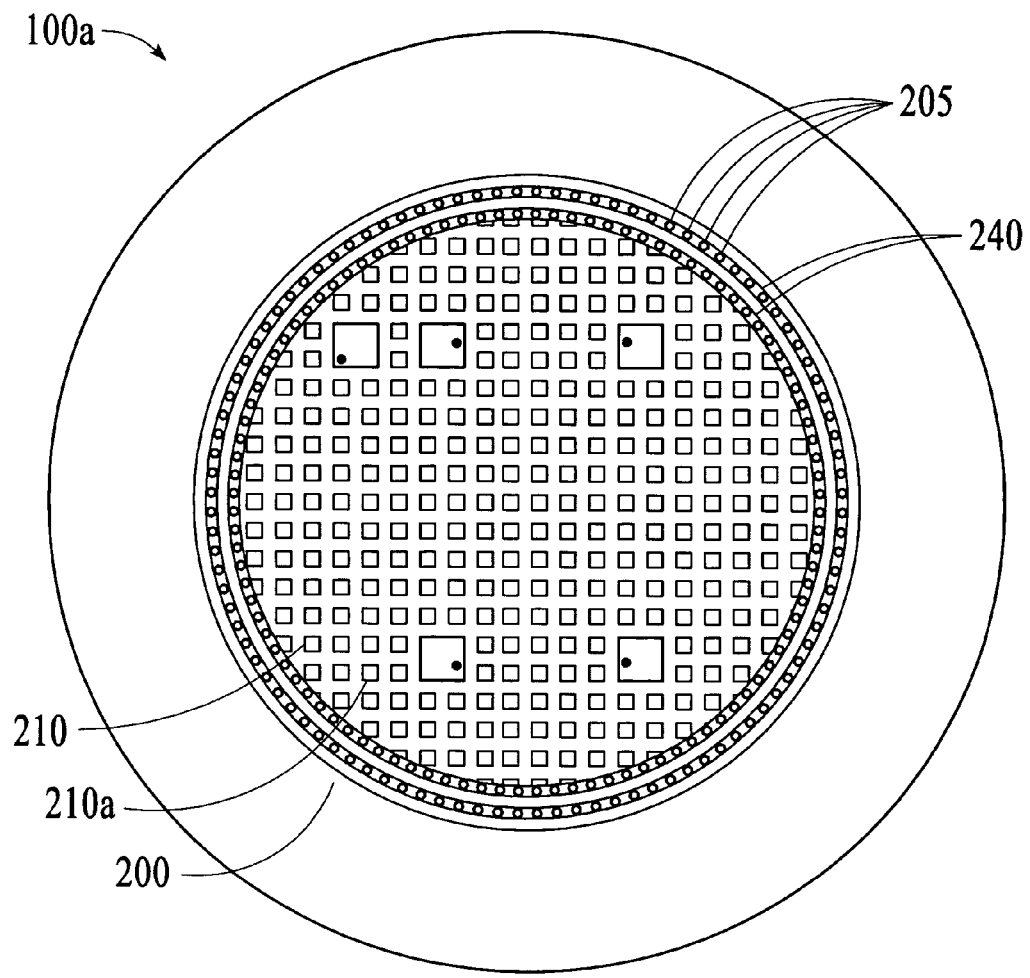
FIG. 2a is a top view of an electrostatic chuck.
Figure 2B:
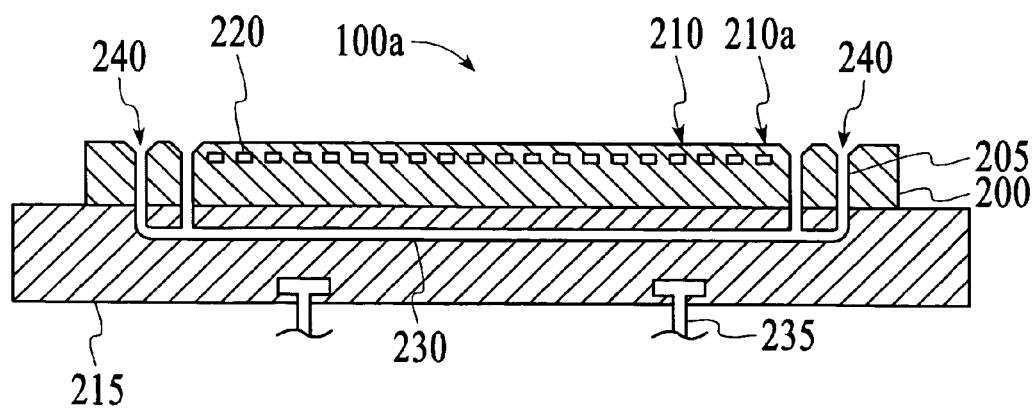

In another version, as illustrated in FIGS. 2a and 2b, the chamber component 100 comprises an electrostatic chuck 100a that is used to hold a substrate 115 on a receiving surface 210a in the process zone 110 of the chamber 105, illustrated as a top view in FIG. 2a and as a cross-sectional side view in FIG. 2b. The electrostatic chuck 100a comprises a metal base 215. The metal base 215 may comprise, for example, aluminum. Above the metal base 215, a ceramic 200 covers an electrode 220 and comprises a receiving surface 210a on which the substrate 115 is held. The ceramic 200 may comprise, for example, a layer or monolith of $Al_2O_3$ or AlN. The ceramic 200 may be bonded, deposited, or plasma sprayed onto the metal base 215. The electrode 220 may comprise a metal mesh embedded in a ceramic monolith, as shown in FIG. 2b, or the electrode 220 may be the metal base 215 with the ceramic 200 as a layer on the metal base 215.

Gas holes 205 in the electrostatic chuck 100a are adapted to transmit a heat transfer gas upwards to the receiving surface 210a to regulate the temperature of the substrate. For example, the gas holes 205 may be used to cool the substrate 115 by extracting heat that is applied by the plasma during processing. The heat transfer gas may comprise helium or another substantially inert gas. The gas holes 205 may have a diameter of from about 110 to about 510 microns, such as from about 125 to about 305 microns.

In one embodiment, the gas holes 205 pass from the receiving surface 210a, through the ceramic 200, and into the metal base 215. A supply channel 230 extends laterally through the metal base 215 and connected to the gas holes 205 to distribute the heat transfer gas to the gas holes 205. The supply channel 230 may have a diameter of from about 101 to about 762 microns, such as from about 127 to about 356 microns.

Additionally, the metal base 215 of the electrostatic chuck 100a may comprise a fluid circulator 235, as shown in FIG. 2b, to regulate the temperature of the electrostatic chuck 100a by circulating a fluid through the metal base 215. The fluid has a sufficiently high specific heat to effectively transfer heat to or from the electrostatic chuck 100a; for example, the fluid may comprise water. Before cleaning the electrostatic chuck 100a, the fluid circulator 235 is flushed with water to remove any glycol and water mixture that can permanently contaminate the electrostatic chuck 100a.

In yet another version, the component 100 comprises a liner (also not shown) disposed about the electrostatic chuck 100a. The liner has one or more gas holes 205 capable of transmitting a gas adjacent to the electrostatic chuck 100a. In one embodiment, the liner is annular and disposed around the electrostatic chuck 100a. A plurality of gas holes 205 are annularly arranged along the liner to introduce a process gas about the periphery of the electrostatic chuck 100a.

Figure 3:
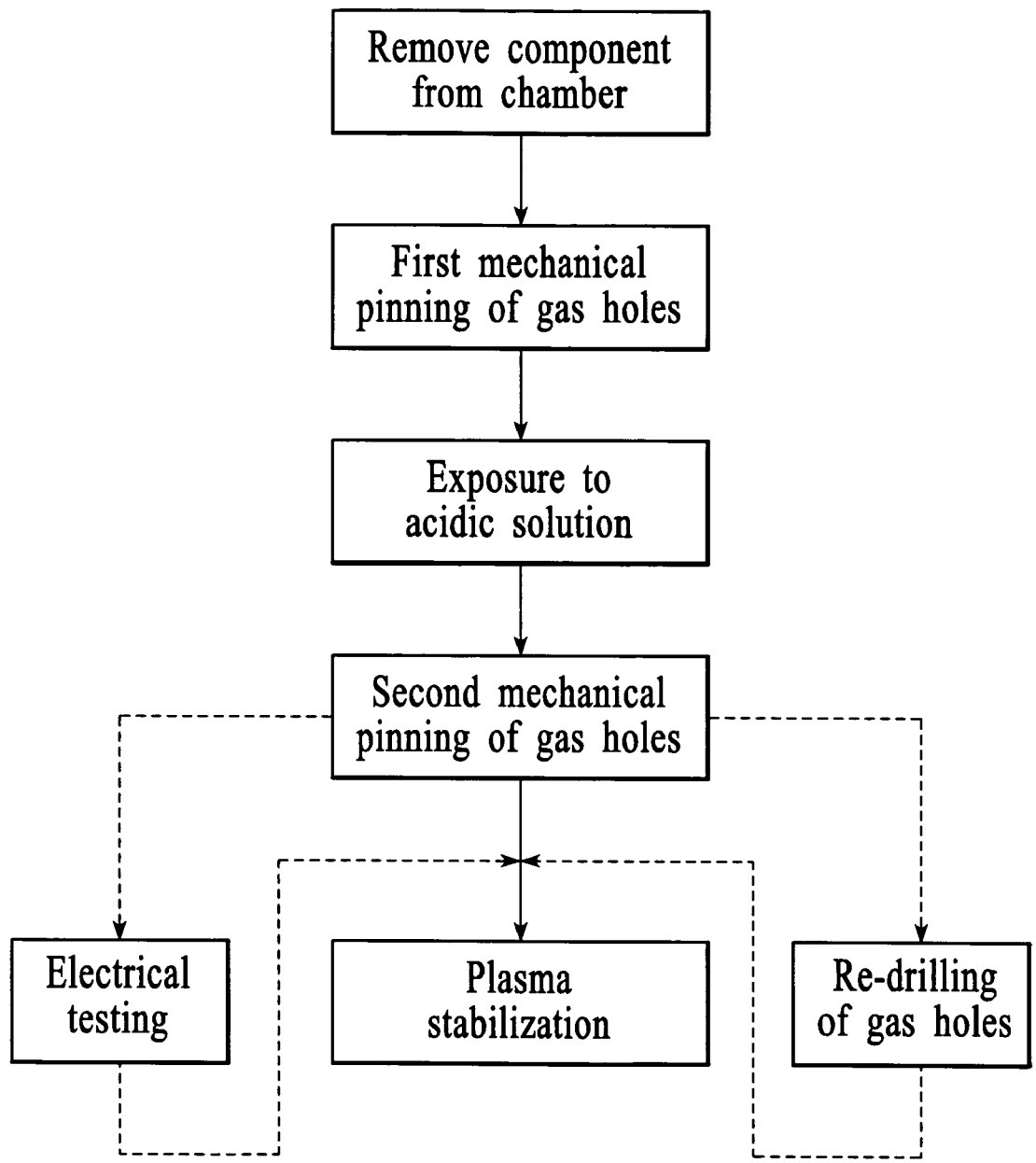
FIG. 3 is a flow chart showing an embodiment of a cleaning process according to the present invention.

A method of cleaning the chamber component 100 is illustrated in the exemplary flow chart of FIG. 3. The cleaning method comprises a sequence of steps that ensure sufficient removal of the process deposits from the component 100 while maintaining a desired shape and size of the gas holes 205 and the structural integrity of the component 100. Certain steps, as for example indicated between the dashed-line arrows in the flowchart, are optional but can result in improved reliability of the cleaned component 100 in operation.

Figure 4A:
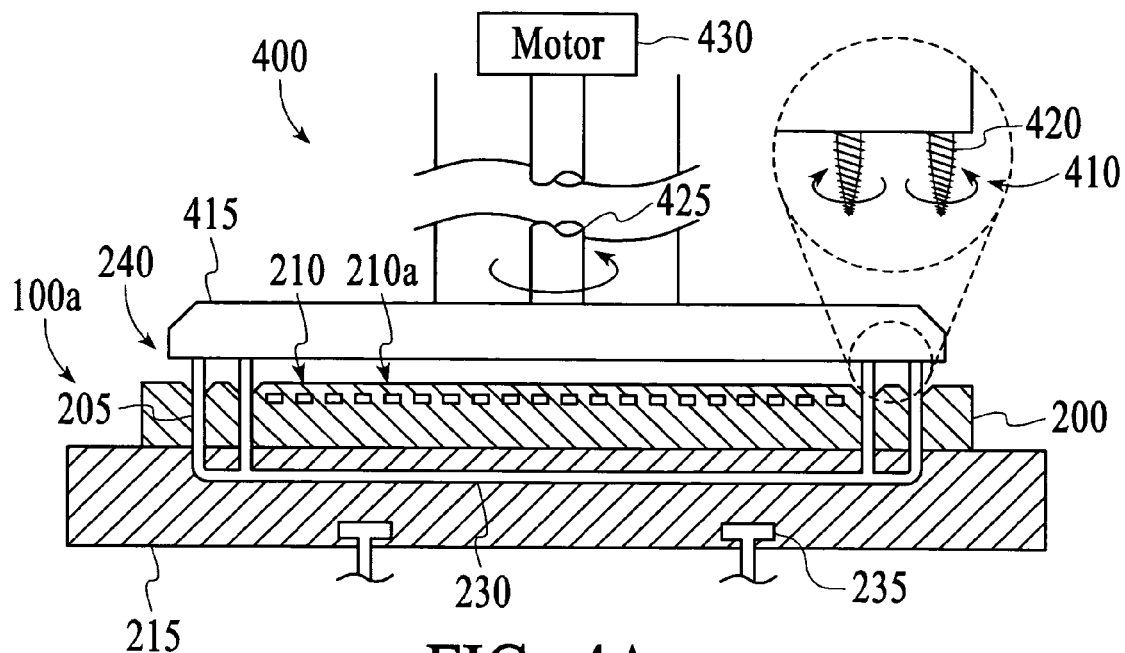
FIG. 4a shows the electrostatic chuck of FIGS. 2a,b, and a mechanical pinning tool with pins that are arranged to clean the gas holes of the electrostatic chuck.

In an initial step of the cleaning process, the gas holes 205 of the component 100 are mechanically pinned to loosen and remove process deposits from the inside surface of the gas holes 205. A mechanical pinning tool 400, an exemplary embodiment of which is illustrated in FIG. 4a, comprises a plurality of elongated pins 410 that are sized and shaped to fit into the gas holes 205. For example, the pins 410 may have a diameter of from about 110 to about 510 microns. The pinning tool 400 is moved up and down such that the pins 410 pass through the insides of the gas holes 205 to dislodge process deposits from the gas holes 205. When the component 100 is the electrostatic chuck 100a comprising the ceramic 200 over the metal base 215, the pin 410 is typically inserted not only through the gas hole portion that is in the ceramic 200 but also into the portion of the gas hole 205 that is in the metal base 215.

In one version, the pins 410 are moved in at least two degrees of freedom within the gas holes 205 to achieve a thorough cleaning effect. For example, the pins 410 may be moved (i) in and out axially through the gas holes 205 and additionally (ii) rotated within the gas holes 205. For improved cleaning, the pins 410 of the pinning tool 400 may be moved through these two degrees of freedom simultaneously. The pins 410 may also be vibrated, such as vibrated axially in the gas holes 205 or laterally back and forth, to loosen and remove the process deposits from the inner surface of the gas holes 205.

Figure 4B:
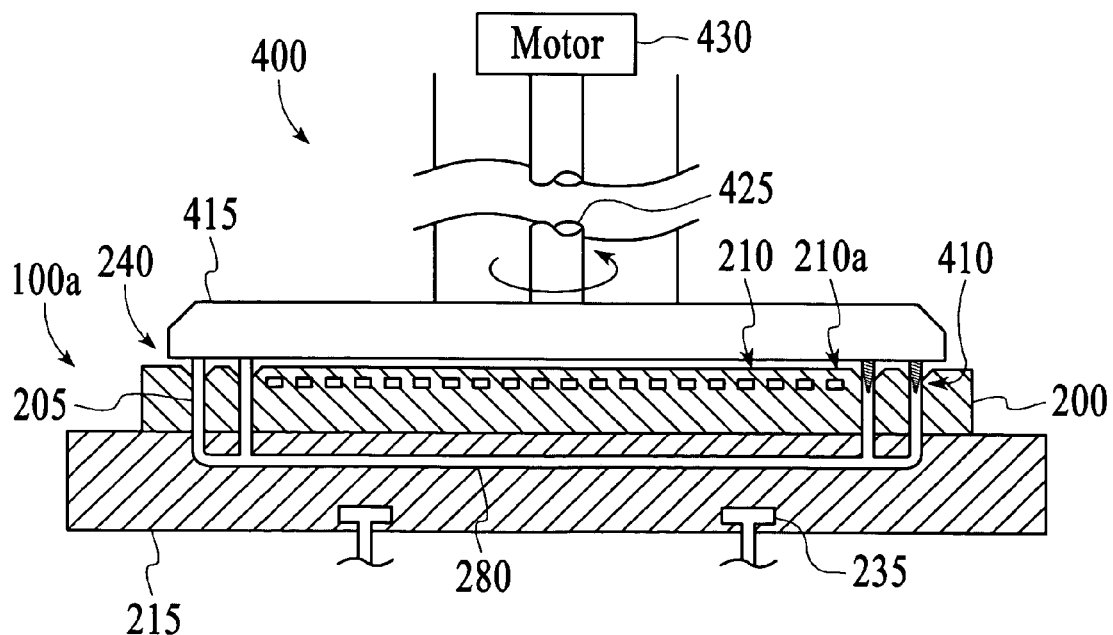
FIG. 4b shows the pins of the mechanical pinning tool engaging the gas holes in the electrostatic chuck to clean the electrostatic chuck.

The pins 410 are arranged and sized to mate with the gas holes 205 and flush undesirable process deposits out from the gas holes 205. For a predetermined layout of the gas holes 205 in the component 100, an example of which is illustrated in the electrostatic chuck of FIG. 4a, the pins 410 are arranged in a corresponding mirror-image configuration to mate with the gas holes 205, as illustrated in FIG. 4b. When the pinning tool 400 is engaged in the component 100, the multiple pins 410 flush out the process deposits from the gas holes 205 in parallel. This parallel cleaning is very time efficient as well as reliable. For example, reliability is increased because the proper mating of two pins guarantees that the remaining pins 410 will also mate properly into their corresponding gas holes 205. The accurate simultaneous mating of all of the pins 410 can reduce the potential for damage to the component 205 or the pins 410.

The pins 410 may be adapted to be removable from the pinning tool 400. For example, the housing 415 may comprise an array of receptors into which the pins 410 can be secured in place. The pins 410 are arranged in the receptors in a configuration to match the layout of the gas holes 205 across the surface 210 of the component 100. Additionally, a pin 410 of a preselected diameter can be inserted into the receptor to clean a gas hole 205 of approximately the same diameter. This modularity allows the same pinning tool 400 to be used to clean different types of electrostatic chucks 100a or even different types of chamber components 100 having different functions, resulting in a cost-effective pinning tool 400 that is not prone to obsolescence.

In one embodiment, the component comprises gas holes 205 arranged in one or more annuli. For example, the electrostatic chuck 100a may comprise a trench 240, at the bottom of which are spaced-apart gas holes 205. The pins 410 protrude from the housing 415 in an arrangement that corresponds to the annular layout of the gas holes 205 in the trench 240. For example, in the embodiment shown in FIGS. 2a and 2b, the electrostatic chuck 100a comprises gas holes 205 arranged as two concentric annuli in two trenches 240 about the circumference of the electrostatic chuck 100a. A matching pinning tool 400, as illustrated in FIG. 4a, comprises pins 410 in a corresponding configuration of two annuli spaced in relation to the spacing of the gas holes 205 in the electrostatic chuck 100a. As illustrated in FIG. 4b, when the pinning tool 400 engages with the electrostatic chuck 100a, the pins 410 pass through their corresponding gas holes 205 to simultaneously dislodge the process deposits from the multiple gas holes 205.

If the pinning tool 400 comprises fewer pins 410 than the number of gas holes 205, the pinning tool 400 is moved across the component 100 between different gas holes 205. For example, the pinning tool 400 may comprise a housing 415 to which are attached fewer pins 410 than the number of gas holes 205. Between pin insertions, the housing 415 is translated or rotated to clean successive groups of gas holes 205. Cleaning the gas holes 205 sequentially may be preferred in some circumstances, such as when different gas holes 205 have different levels of process deposit build-up. Sequential cleaning can reveal the relative levels of process deposit build-up in the various gas holes 205 according to how much frictional resistance is encountered when each gas hole 205 is flushed out. For substantially differing levels of process deposit build-up, this method may even reduce the potential for damage to the pins 410. In an illustrative example, if 30 pins 410 are being forced into 30 gas holes 205, but only one gas hole 205 has sufficient process deposit build-up to completely stop the passage of its corresponding pin 410, all of the force applied to the 30 pins will be concentrated on this single pin 410. This massive concentration of force could cause breakage of the pin 410. By separating the gas holes 205 into individual groups that are cleaned sequentially, this danger is substantially avoided.

In one version, the pins 410 are texturized to more effectively remove the process deposits from the gas holes 205. For example, the pins 410 may comprise an abrasive coating 420, as shown in the exploded view of FIG. 4a, to enhance the cleaning efficiency. For example, the pins 410 may comprise a coating 420 of abrasive particulates. In one embodiment, the pins 410 comprise a coating 420 of diamond dust, which is exceptionally durable and incisive. As the pins 410 are moved within the gas holes 205, the abrasive particulates scrape against the process deposits such that sharp edges of the abrasive particulates grind and cut away at the process deposits. Alternatively, the pins 410 may be tapered and comprise grooves (not shown) to drill inside the gas holes 205. As the tapered, grooved pins 410 rotate, they cut away at process deposits inside the gas holes 205. The texturized pins 410 also re-create a desired size and shape of the gas holes 205 by cutting away any undesired material. The material that is cut away may include remaining process deposits or the material that the component 100 is made of, such as a ceramic material of the ceramic 200 of the electrostatic chuck 100a.

Figure 5:
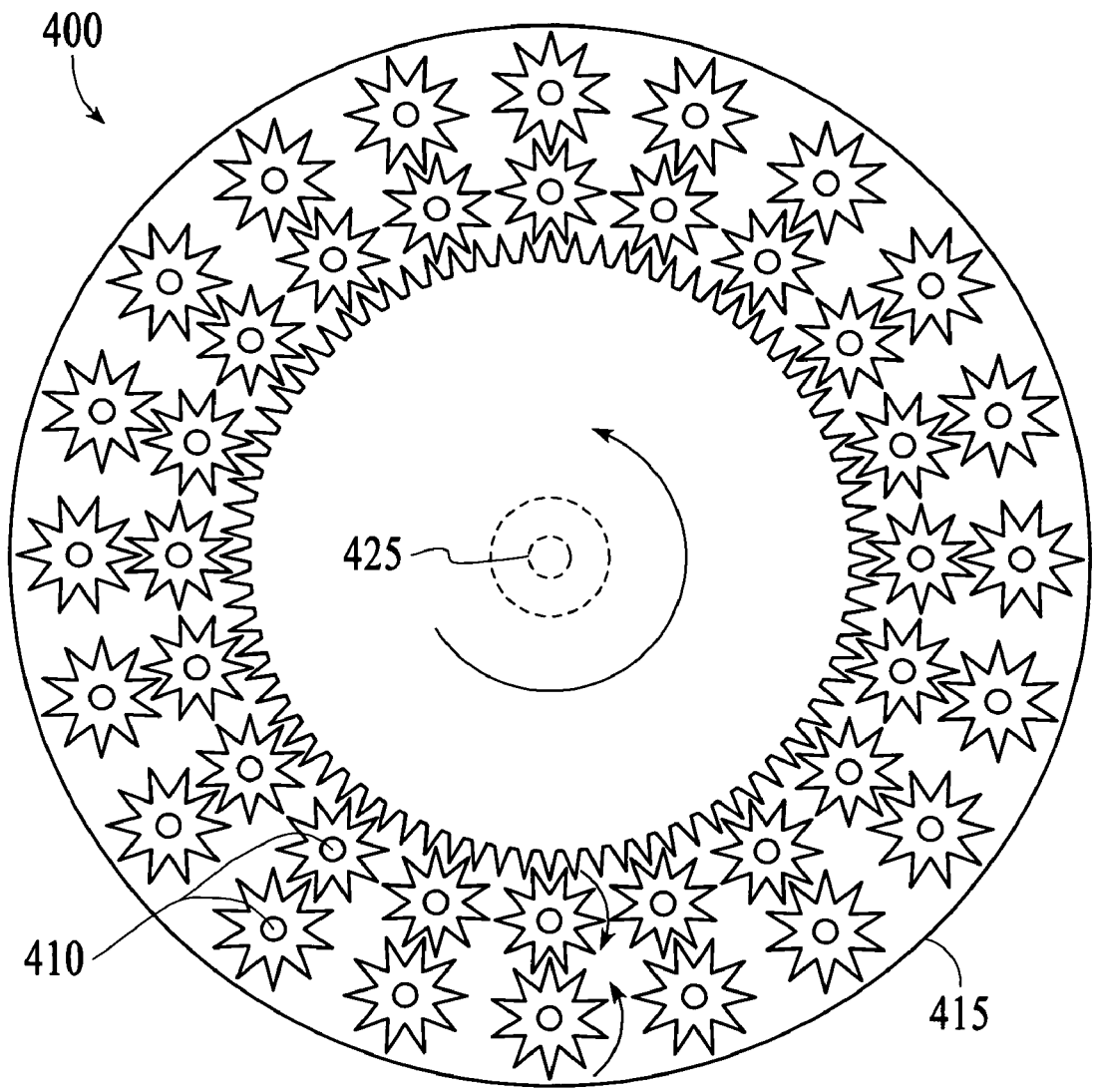
FIG. 5 is a cross-sectional bottom view of a mechanical pinning tool with a shaft that is mechanically engaged to the pins.

The pinning tool 400 may comprise a shaft 425 that is mechanically engaged to an electric motor 430, such that the shaft 425 rotates when the motor 430 is actuated, as illustrated in FIG. 4b. Furthermore, the shaft 425 may be mechanically engaged to the pins 410 such that that the pins 410 rotate about their own individual longitudinal axes when the motor 430 is driving the shaft 425 about the longitudinal shaft axis, an exemplary embodiment of which is illustrated in FIG. 5. For example, the shaft 425 can be mechanically engaged to the pins 410 by gears (as shown) or flexible bands (not shown) to transfer the rotational motion of the shaft 425 to the pins 410. During each pin insertion, the shaft 425 is rotated to rotate the pins 410 about their own individual axes. The electric motor 430 can provide a high rotational speed to the pins 410 to increase the speed of cleaning of the gas holes 205 and to be able to effectively clean particularly dirty gas holes 205. In one embodiment, the electric motor 430 generates a rotational speed of the pins 410 of from about 500 to about 5000 revolutions per minute. The in and out motion of the pins 410 may be provided by a human operator or an additional motor in simultaneity with the rotational motion.

After mechanically pinning the gas holes 205 of the component 100, the component 100 is further cleaned by exposure to an acidic solution. The component 100 can be cleaned by dipping, immersing, or otherwise exposing at least the surface 210 of the component 100 in the acidic solution. A portion of the insides of the gas holes 205 may also be cleaned by passing the acidic solution into the gas holes 205, such as by immersing the component 100 into the acidic solution at a sufficient depth that the acidic solution penetrates the gas holes 205. The preceding mechanical pinning abrades the process deposits such that small, ground fragments of the process deposits remain within the gas holes 205. The acidic solution washes away the process deposit particulates and further erodes or softens any residual process deposits that were not fully removed during the mechanical pinning, especially on the surface 210 of the component 100.

For example, to clean an electrostatic chuck 100a, the ceramic 200 of the electrostatic chuck 100a is exposed to the acidic solution. The receiving surface 210a of the ceramic 200 is immersed in an acidic solution that is capable of at least partially removing the process deposits from the receiving surface 210a and portions of the gas holes 205 within the ceramic 200. The acidic solution is sufficiently inert to the ceramic 200 that the receiving surface 210a of the ceramic 200 is substantially undamaged during exposure to the acidic solution. The acidic solution may be applied to the ceramic 200 substantially without exposing the metal base 215 to the acidic solution because exposure of the metal base 215 to the acidic solution can corrosively damage the metal base 215.

The conditions under which the component 100 is exposed to the acidic solution are set to remove a substantial amount of the process deposits from the surface 210 of the component 100 without damaging the component 100. For example, the acidic solution may be maintained at a temperature of from about 70° C. to about 90° C., such as about 80° C. The component 100 may be exposed to the acidic solution for a time period of from about 5 to about 45 minutes, such as of from about 10 to about 30 minutes.

The acidic solution comprises dissolved acidic species that are capable of removing process deposits from the surface 210 of the component 100 by reacting with the process deposits to form species that readily dissolve in the acidic solution. The composition of the acidic solution is selected according to the composition of the component surface 210 and the composition of the process deposits. In one version, the acidic solution comprises hydrofluoric acid (HF). Hydrofluoric acid can react with and dissolve impurities that may have accumulated on the component surface 210, such as $SiO_2$, CaO or MgO, that may occur in an aluminum oxide ceramic structure. The acidic solution may additionally or alternatively comprise a non-fluorinated acid, such as nitric acid ($HNO_3$). The non-fluorinated agent may provide less aggressive chemical species, which allows for the cleaning and preparation of the component surface 210 with reduced formation of erosion cracks. Other suitable acidic species may comprise, for example, HCl, $H_3PO_4$, and $H_2SO_4$.

In one exemplary embodiment, the acidic solution comprises an aqueous solution of hydrofluoric acid (HF), nitric acid ($HNO_3$), and de-ionized water. The ratio of $HNO_3$ to HF, by weight, in the aqueous solution may be from about 3 to about 4, such as about 3.5. For example, the aqueous solution may comprise about four percent hydrofluoric acid in a 49% strength (weight/weight) of HF, about ten percent nitric acid in a 70% strength (weight/weight) of $HNO_3$, and de-ionized water.

After exposure of the component 100 to the acidic solution, the component 100 may again be mechanically pinned to remove remaining process deposits in the gas holes 205. This secondary mechanical pinning step helps to ensure a desired aperture shape of the gas holes 205. For example, if the metal base 215 is not exposed to the acidic solution, process deposits of the type that were cleared away from the portions of the gas holes 205 in the ceramic 200 may remain in the portions of the gas holes 205 in the metal base. The secondary mechanical pinning step ensures that sufficient space is cleared through the portions of the gas holes 205 that are in the metal base 215.

After mechanical and acidic cleaning, the electrostatic chuck 100a can be electrically tested to ensure that electrical characteristics of the electrostatic chuck 100a are satisfactory. For example, the electrostatic chuck 100a may be tested to ensure that a sufficient chucking voltage may be generated from the electrode 220 to hold a substrate 115 with sufficiently high and sufficiently uniform force. To carry out the testing, electrical leads (not shown) may be connected to two or more points of the electrostatic chuck 100a and an electric potential applied between the electrical leads to measure an electrical resistance between the points. Based on the distance between the points, the electrical resistivity of the ceramic of the electrostatic chuck 100a can be determined. Additionally, leakage current from electrode 220 can be determined, such as by inserting an ammeter (not shown) in the current path between the electrode voltage supply 135 and the electrode 220.

Additionally, the component 100 is stabilized in the process chamber 105 by exposure to an energized gas. In one version, the energized gas is a non-reactive gas. First, the component 100 is inserted into the process chamber 105. A non-reactive gas, which is substantially inert to the component material, is introduced into the plasma zone 110. For example, the non-reactive gas may comprise nitrogen. Nitrogen is a substantially inert gas and tends to be relatively inexpensive. Alternatively, the non-reactive gas may comprise argon. Argon has a relatively high density, and is especially inert because it is a noble gas. A plasma is formed from the non-reactive gas in the plasma zone 110. After stabilization of the component 100 is complete, the non-reactive gas is exhausted from the chamber 105.

Exposure of the component 100 to the non-reactive plasma causes the component 100 to purge vaporized contaminants, referred to as "outgassing." For example, if the ceramic 200 of the electrostatic chuck 100a comprises a partially porous ceramic, chemicals may be trapped in the pores. When the ceramic is exposed to the plasma, the chemicals are vaporized and released from the pores. If the component 100 were not outgassed in this preliminary step, the component 100 would outgas during processing of the substrate 115 in the chamber 105, undesirably increasing the pressure in the process zone 110 and contaminating the substrate 115.

In addition to outgassing, the component 100 becomes accustomed to the physical conditions in the plasma, such as the temperature, pressure, and electromagnetic field. This increases stability during the actual substrate processing because the component 100 does not react unexpectedly to the reactive gas used during the actual processing of the substrate 115. For example, the stabilization step improves the resistance of the component 100 to corrosion by the reactive gas. This improves the performance and increases the operational lifetime of the chamber component 100.

Returning to the substrate processing apparatus 120 schematically illustrated in FIG. 1, the process chamber 105 comprises sidewalls 125, a bottom wall (not shown), and a ceiling 130 that faces the substrate 115. The ceiling 130 may act as an anode and may be grounded (as shown) or electrically biased by a power supply (not shown). The chamber 105 may be fabricated from any of a variety of materials, including metals, semiconductors, ceramics, glasses, polymers and composite materials. For example, metals commonly used to fabricate the chamber 105 include aluminum, anodized aluminum, "HAYNES 242," "Al-6061," "SS 304," "SS 316," and INCONEL. The ceiling 130 may comprise a flat, rectangular, arcuate, conical, dome or multiradius-arcuate shape. The particular embodiment of the apparatus 120 shown in FIG. 1 is suitable in the fabrication of electronic devices on a substrate 115, and is provided only to illustrate the invention. This particular embodiment should not be used to limit the scope of the invention.

The electrostatic chuck 100a of the process chamber 105 is adapted to electrostatically hold the substrate 115 and regulate the temperature of the substrate 115. The electrostatic chuck 100a is connected to an electrode voltage supply 135 to electrostatically hold the substrate 115 in the process zone 110. The electrode voltage supply 135 comprises an AC voltage supply 140 that applies an alternating voltage to the electrode 220 to affect the ion energy of the plasma. A DC voltage supply 145 biases the electrode 220 to create an electrostatic downward force on the substrate 115. A heat displacer 150 is provided to pass the heat transfer gas into the supply channel 230 and through the gas holes 205 to contact the backside of the substrate 115 on the electrostatic chuck 100a. For example, the heat displacer 150 may comprise a pump (not shown) to recirculate the heat transfer gas through the supply channel 230 and a heat sink (not shown) to conduct heat away from the recirculating heat transfer gas.

The process chamber 105 may be a chemical vapor deposition (CVD) chamber to deposit material on a substrate 115, such as to deposit a silicon-containing material, such as polysilicon, silicon nitride, silicon oxide or metal silicide, to deposit a metal-containing material, such as aluminum or copper, or to deposit any other material on the substrate 115. For example, an insulator or dielectric material, such as for example, $SiO_2$ or $Si_3N_4$, may be formed by chemical vapor deposition (CVD) using a process gas comprising one or more of $SiH_4$, $SiCl_2H_2$, $CO_2$, $H_2$, $N_2O$, $Si(OC_2H_5)_4$, $NH_3$ and $N_2$. Alternatively, a metal-containing material, which may comprise an elemental metal, metal compound or a metal alloy, may also be formed on the substrate 115. For example, a tungsten-containing material may be deposited using a process gas comprising one or more of $WF_6$, $H_2$ and $SiH_4$; a molybdenum-containing material may be formed using, for example, process gas comprising $MoCl_5$ and $H_2$; and an aluminum-containing material may be formed using, for example, $AlCl_3$ or $Al(CH_3)_3$ mixed with Ar or $H_2$ or both.

A gas energizer 180 energizes the process gas introduced into the chamber 105 to form a plasma. The gas energizer 180 couples electromagnetic power, such as RF (radio frequency) power, into the process gas. A suitable gas energizer 180 comprises an inductor antenna 184 having one or more inductor coils 188 above the ceiling 130 of the chamber 105. In one version, the coils 188 have a circular symmetry about a central axis of the chamber 105 to provide a good inductive flux into the process gas. In this version, the ceiling 105 may comprise a dielectric material that is permeable to the electromagnetic energy, such as silicon or silicon dioxide. An antenna power supply 192 applies AC power, such as RF power, to the antenna via a match network 196 that tunes the applied power to optimize the inductive coupling of the power to the process gas.

The process gas in the chamber 105 is exhausted by an exhaust system 133 that includes an exhaust conduit 136, an exhaust line 139, a throttle valve 142, and pumps 146 that can include roughing and turbo-molecular pumps. The pumps 146 may further comprise scrubber systems to clean the exhaust gas. The exhaust conduit 136 is a port or channel that receives the exhaust gas provided in the chamber 105, and that is typically positioned around the periphery of the substrate 105. The exhaust line 139 connects the exhaust conduit 136 to the pumps 146, and the throttle valve 142 in the exhaust line 139 may be used to control the pressure of process gas in the chamber 105.

The substrate processing in the chamber 105 may be implemented using a controller 154. The controller 154 comprises a central processing unit (CPU) interconnected with a memory and peripheral control components. The CPU may comprise, for example, a 68040 microprocessor, commercially available from Synergy Microsystems Inc., San Diego, Calif. The controller 154 comprises a computer program product, which comprises program code embodied on a computer-readable medium, such as the memory of the controller 154. The program code can be written in any conventional computer-readable programming language, such as for example, assembly language or C++. Suitable program code is entered into a single file, or multiple files, using a conventional text editor, and stored or embodied in the computer-readable medium. If the entered code text is in a high level language, the code is compiled, and the resultant compiler code is then linked with an object code of pre-compiled windows library routines. To execute the linked compiled object code, the operator invokes the program code, causing the controller 154 to load the object code into the computer-readable medium. The CPU reads and executes the program code to perform the tasks identified therein.

In one illustrative embodiment of stabilizing the chamber component 100, the component 100 is installed in the chamber 105. A blank silicon wafer is placed on the electrostatic chuck 100a as a "dummy" substrate. The gas distributor 180 introduces a non-reactive gas comprising a mixture of $N_2$ and Ar into the process zone 110 while the throttle valve 142 is maintained in a closed position to accumulate pressure in the process zone 110. When the pressure in the process zone 110 reaches about 100 mTorr, the antenna power supply 192 applies an RF power of from about 200 to about 1000 watts to the inductor antenna 184 to strike a plasma from the non-reactive gas at a preselected plasma density that is suitable for stabilization. The throttle valve 142 is opened to allow a flow of the non-reactive gas through the process zone 110. Then, the electrode voltage supply 135 applies an RF bias to the electrode 220 at a power of from about 100 to about 300 Watts, such as about 200 Watts, to achieve a preselected ion energy in the plasma that is suitable for stabilization. The plasma is maintained for a duration of from about 5 to about 20 minutes before the stabilization process is terminated.

A component 100 that is cleaned according to the method described above is cleaned more thoroughly, undergoes less damage during cleaning, and has an extended operational lifetime when compared components that are cleaned by conventional cleaning processes. For example, the lifetime of the electrostatic chuck 100a may be extended by at least twice.

Although exemplary embodiments of the present invention are shown and described, those of ordinary skill in the art may devise other embodiments which incorporate the present invention, and which are also within the scope of the present invention. For example, the chamber component 100 that is cleaned may be a component 100 other than those specifically mentioned. Also, the ceramic 200 and metal base 215 of the electrostatic chuck 100a may comprise materials other than those specifically mentioned, as would be apparent to one of ordinary skill in the art. Furthermore, the terms below, above, bottom, top, up, down, first, and second, and other relative or positional terms are shown with respect to the exemplary embodiments in the Figures and are interchangeable insofar as objects can be rotated or translated in space. Therefore, the appended claims should not be limited to the descriptions of the preferred versions, materials, or spatial arrangements described herein to illustrate the invention.

What is claimed is:

1. A method of cleaning process deposits from a component of a process chamber, the component having a plurality of gas holes, the method comprising:

(a) mechanically pinning the gas holes of the component to clean the process deposits in the gas holes;
(b) exposing the component to an acidic solution; and
(c) plasma stabilizing the component by:
(1) placing the component into a plasma zone;
(2) introducing a gas into the plasma zone;
(3) forming a plasma of the gas in the plasma zone; and
(4) exhausting the gas from the plasma zone.

2. A method according to claim 1 comprising repeating (a) before and after (b).

3. A method according to claim 1 wherein the component comprises a ceramic covering an electrode, and wherein (b) comprises exposing the ceramic to an acidic solution comprising hydrofluoric acid and nitric acid.

4. A method according to claim 3 wherein the acidic solution comprises nitric acid and hydrofluoric acid in a ratio by weight of from about 3 to about 4.

5. A method according to claim 1 wherein (c)(2) comprises introducing a non-reactive gas into the plasma zone.

6. A method according to claim 5 wherein (c)(2) comprises introducing a non-reactive gas comprising argon or nitrogen into the plasma zone.

7. A method according to claim 1 comprising, before (c), testing the electrical resistance of the ceramic.

8. A method of cleaning process deposits from an electrostatic chuck, the electrostatic chuck having a plurality of gas holes and comprising a ceramic covering an electrode, and the method comprising:
(a) mechanically pinning the gas holes in the electrostatic chuck to clean the process deposits in the gas holes;
(b) exposing the ceramic to an acidic solution comprising hydrofluoric acid and nitric acid;
(c) repeating (a) after (b);
(d) testing the electrical resistance of the ceramic;
(e) plasma stabilizing the electrostatic chuck by:
(1) placing the electrostatic chuck into a plasma zone;
(2) introducing a non-reactive gas into the plasma zone;
(3) forming a plasma of the non-reactive gas in the plasma zone; and
(4) exhausting the non-reactive gas from the plasma zone.

9. A method according to claim 8 wherein in (b) the ratio of nitric acid to hydrofluoric acid by weight is from about 3 to about 4.

10. A method according to claim 8 wherein in (e)(2) the non-reactive gas comprises argon or nitrogen.

11. A method according to claim 8 wherein the electrostatic chuck comprises a metal base below the ceramic, wherein the metal base may be the electrode, and wherein (b) comprises exposing the ceramic of the chuck to the acidic solution substantially without exposing the metal base to the acidic solution.

* * * * *